United States Patent
Fogel et al.

(10) Patent No.: US 7,291,539 B2
(45) Date of Patent: Nov. 6, 2007

(54) AMORPHIZATION/TEMPLATED RECRYSTALLIZATION METHOD FOR HYBRID ORIENTATION SUBSTRATES

(75) Inventors: Keith Edward Fogel, Hopewell Junction, NY (US); Katherine L. Saenger, Ossining, NY (US); Chun-Yung Sung, Poughkeepsie, NY (US); Haizhou Yin, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 11/142,646

(22) Filed: Jun. 1, 2005

(65) Prior Publication Data

US 2006/0276011 A1 Dec. 7, 2006

(51) Int. Cl.
*H01L 21/76* (2006.01)
(52) U.S. Cl. .............. 438/424; 438/198; 438/406; 438/486
(58) Field of Classification Search ........ 438/198, 438/404, 405–407, 423–424, 486; 257/E21.567, 257/E21.088, E21.122
See application file for complete search history.

(56) References Cited

U.S. PATENT DOCUMENTS 7,060,585 B1 6/2006 Cohen et al.

2005/0116290 A1* 6/2005 de Souza et al. .......... 257/347
2006/0154429 A1* 7/2006 de Souza et al. .......... 438/305

* cited by examiner

*Primary Examiner*—Thanhha S. Pham
(74) *Attorney, Agent, or Firm*—Scully, Scott, Murphy & Presser, P.C.; Robert M. Trepp, Esq.

(57) ABSTRACT

The present invention provides an improved amorphization/templated recrystallization (ATR) method for fabricating low-defect-density hybrid orientation substrates. ATR methods for hybrid orientation substrate fabrication generally start with a Si layer having a first orientation bonded to a second Si layer or substrate having a second orientation. Selected regions of the first Si layer are amorphized and then recrystallized into the orientation of the second Si layer by using the second Si layer as a template. The process flow of the present invention solves two major difficulties not disclosed by prior art ATR methods: the creation of "corner defects" at the edges of amorphized Si regions bounded by trenches, and undesired orientation changes during a high temperature post-recrystallization defect-removal annealing of non-ATR'd regions not bounded by trenches. In particular, this invention provides a process flow comprising the steps of (i) amorphization and low-temperature recrystallization performed in substrate regions free of trenches, (ii) formation of trench isolation regions that subsume the defective regions at the edge of the ATR'd regions, and (iii) a high-temperature defect-removal anneal performed with the trench isolation regions in place.

14 Claims, 10 Drawing Sheets

US 7,291,539 B2

AMORPHIZATION/TEMPLATED RECRYSTALLIZATION METHOD FOR HYBRID ORIENTATION SUBSTRATES

RELATED APPLICATIONS

This application is related to U.S. patent application Ser. No. 11/031,142 entitled "Method for fabricating low-defect-density changed orientation Si," filed Jan. 7, 2005, and to U.S. patent application Ser. No. 10/725,850, entitled "Planar substrate with selected semiconductor crystal orientations formed by localized amorphization and recrystallization of stacked template layers," filed Dec. 2, 2003. The contents of each of the aforementioned U.S. Patent Applications are incorporated herein by reference in their entirety.

FIELD OF THE INVENTION

The present invention relates to crystalline substrate structures such as, for example, high-performance complementary metal oxide semiconductor (CMOS) circuits, in which carrier mobility is enhanced by utilizing different semiconductor surface orientations for p-channel field effect transistors (pFETs) and n-channel field effect transistors (nFETs). More particularly, the present invention relates to an improved amorphization/templated recrystallization technique for fabricating planar hybrid orientation substrate structures comprising semiconductors with different surface crystal orientations.

BACKGROUND OF THE INVENTION

Semiconductor device technology is increasingly relying on specialty semiconductor substrates to improve the performance of the n-channel MOSFETs (nFETs) and p-channel MOSFETs (pFETs) in complementary metal oxide semiconductor (CMOS) circuits. For example, the strong dependence of carrier mobility on silicon orientation has led to increased interest in hybrid orientation Si substrates in which nFETs are formed in (100)-oriented Si (the orientation in which electron mobility is higher) and pFETs are formed in (110)-oriented Si (the orientation in which hole mobility is higher), as described by M. Yang, et al. in "High Performance CMOS Fabricated on Hybrid Substrate with Different Crystal Orientations," IEDM 2003 Paper 18.7 and U.S. patent application Ser. No. 10/250,241, filed Jun. 17, 2003 entitled "High-performance CMOS SOI devices on hybrid crystal-oriented substrates."

Amorphization/templated recrystallization (ATR) methods for fabricating hybrid orientation substrates such as disclosed, for example, in U.S. patent application Ser. No. 10/725,850, filed Dec. 2, 2003 entitled "Planar substrate with selected semiconductor crystal orientations formed by localized amorphization and recrystallization of stacked template layers," typically start with a first semiconductor layer having a first orientation directly bonded to a second semiconductor layer having a second orientation different from the first. Selected areas of the first semiconductor layer are amorphized by ion implantation, and then recrystallized into the orientation of the second semiconductor layer using the second semiconductor layer as a crystal template.

FIGS. 1A-1D show a "top amorphization/bottom templating" version of the ATR method of U.S. patent application Ser. No. 10/725,850 for forming a bulk hybrid orientation Si substrate. In this version of ATR, the first semiconductor layer being amorphized is on the top and the second semiconductor layer acting as a template is on the bottom. Specifically, FIG. 1A shows the starting substrate 10 which comprises a top silicon layer 20 having a first crystal orientation, a bottom silicon layer or substrate 30 having a second crystal orientation different from the first, and a bonded interface 40 between them. FIG. 1B shows the substrate of FIG. 1A (designated now as 10') after formation of dielectric-filled shallow trench isolation (STI) regions 50. Selected regions of top Si layer 20 are then subjected to amorphizing ion implant 60 to produce one or more amorphized regions 70, as shown in FIG. 1C. The amorphizing ion implant 60 would typically be performed with Si or Ge ions. Amorphized regions 70 span the entire thickness of the upper Si layer 20, and extend into the lower Si layer 30. The amorphized regions 70 are then recrystallized into the second crystal orientation, using the lower Si layer 30 as a template, to produce (idealized) planar hybrid orientation substrate 80 with recrystallized, changed-orientation Si region 90. In this example, the orientations of Si regions 30 and 90 may have a (100) orientation, while the Si regions 20 may have a (110) orientation.

In contrast to the idealized outcome shown in FIG. 1D, recrystallization of the amorphized Si region 70 in the structures of FIG. 1C would typically result in the structure of FIG. 2A, with end-of-range defects 97 and corner defects 99. End-of-range defects are well studied and have been reported in, for example, J. P. de eSouza and D. K. Sadana, in *Handbook on Semiconductors: Materials, Properties and Preparation,* edited by S. Mahajan (North Holland, 1994), Vol. 3b, p. 2033, and corner defects have been described previously by N. Burbure and K. S. Jones in "The effect of oxide trenches on defect formation and evolution in ion-implanted silicon," Mat. Res. Soc. Symp. Proc. 810 C4.19 (2004). As described in U.S. patent application Ser. No. 11/031,142, end-of-range defects 97 remaining after ATR may be eliminated by including a high temperature (approximately 1300° C.) anneal as part of the recrystallization process, as shown in FIG. 2B. However, this high temperature annealing is not expected to be effective in eliminating corner defects 99. While more aggressive annealing (e.g., more than a few hours at temperatures higher than 1300° C.) might help to a limited degree, it is not a preferred option due to concerns about reaction and dissolution of oxide layers contained in the STI fill.

FIGS. 3A-3E show the geometry of corner defects 99 in relation to a FET device that might comprise ATR'd region 90. Specifically, FIGS. 3A-3B show top views of ATR'd region 90 with (FIG. 3B) and without (FIG. 3A) FET 112 including a gate and a gate dielectric. Reference numeral 50 denotes the dielectric filled trench region. FIGS. 3C-3E show cross section views of FIG. 3B through lines C-C1, D-D1, and E-E1, respectively. Corner defects 99 are a particular concern in circled regions 118, where they are directly under the gate and the gate dielectric of FET 112 and may contribute to undesirable leakage.

One could devise methods to repair corner defects 99, but none appear to be very practical. For example, one could re-amorphize the ATR'd regions to a shallower depth than the initial amorphization, and then recrystallize. This would still leave corner defects, but they would be smaller, since the corner defect size scales with the amorphization depth, as discussed in the publication by Burbure and Jones mentioned above. Alternatively one could remove the corner defect regions and replace them with an insulator or epitaxially-grown Si. However, the steps to do this are quite involved. It is therefore clear that the preferred approach would be to avoid forming corner defects in the first place.

Corner defect formation can be avoided with the the ATR-before-STI process flow of FIGS. 4A-E. Specifically, FIG. 4A shows a starting substrate 10 such as shown in FIG. 1A. FIG. 4B shows the substrate 10 of FIG. 4A being subjected to amorphizing ion implant 60 to produce one or more amorphized regions 120 and non-amorphized regions 20'. Amorphized regions 120 span the entire thickness of the upper Si layer 20, and extend into the lower Si layer 30. Amorphized regions 120 are then recrystallized using the lower Si layer 30 as a template to produce changed-orientation Si region 130 bordered below by end-of-range defects 97 and bordered laterally by potentially defective edge regions 140, as shown in FIG. 4C. End-of range defects 97 are then removed by a high temperature defect-removal anneal leaving annealed edge regions 140', as shown in FIG. 4D. Annealed edge regions 140' are then replaced by STI regions 150, as shown in FIG. 4E.

FIGS. 5A-5D, which are provided by the applicants of the present application, show cross-section SEM images of border regions corresponding to 140 in FIG. 4C for the case of a 200-nm-thick 110-oriented Si DSB (direct silicon bonded) layer on a 100-oriented Si handle wafer. All samples were first coated with Cr, cleaved, and then subjected to a short Secco etch to highlight interfaces and defects. The Secco etch includes a mixture of HF, $K_2CrO_7$, and $H_2O$. FIG. 5A shows a sample after a patterned amorphization with $4E15/cm^2$ 220 keV Ge at a substrate temperature of 10° C., prior to recrystallization annealing. Amorphized region 155 is bordered below by 100-oriented substrate 157 and bordered laterally by non-amorphized 110-oriented DSB region 159. Bonded interface 161 is between Si substrate 157 and a DSB region 159. Non-amorphized DSB regions comprise 5 µm squares (aligned with the 110 directions of the 100-oriented substrate) on approximately 10 µm centers. FIGS. 5B-5C show the sample of FIG. 5A after a 900° C./1 minute rapid thermal recrystallization anneal along two perpendicular cleaves coinciding with the 110 directions of the 100-oriented substrate, one along the 100 direction of the DSB layer and the other perpendicular to it. Region 163 has recrystallized into the 100 orientation of the substrate, separated from the 110-oriented regions by angled interfaces 165 and/or 167.

The images of FIGS. 5B-5C make it clear that the orientation-changing ATR methods taught in U.S. patent application Ser. No. 10/725,850 can provide structures including Si regions of different orientations laterally separated by characteristically angled border regions. The form and defectivity of these border regions depends on the kinetics of the various growth fronts as well as the initial orientation of the crystal planes from which the recrystallization is templated; for example, defective region 171 is present in the image of FIG. 5B, but not the image of FIG. 5C. In view of the possibility that these characteristically angled border regions will have uses not anticipated or described in the prior art, it is therefore asserted that the hybrid orientation ATR methods taught by U.S. patent application Ser. No. 10/725,850 may be employed to create Si regions with these characteristically distinctive borders, without departing from the scope of the original inventive method.

While solving the corner defect problem, the ATR-before-STI approach of FIGS. 4A-4E unfortunately gives rise to another problem: when the recrystallization and high temperature defect-removal anneals are performed before STI formation, the non-ATR'd Si regions (or islands) 20' can "disappear" by converting to the orientation of the underlying substrate. FIG. 5D shows a cross section analogous to the one of FIG. 5C at early stages of this disappearance/conversion process (i.e., after a slow furnace ramp to 1250° C.). The image suggests that (at least for the case of the 110-oriented islands embedded in a 100-oriented substrate) disappearance of non-ATR'd regions proceeds by a gradual bottom corner rounding or erosion rather than by a lateral translation of the edge regions. Interestingly, the stability of non-ATR'd 110-oriented Si islands embedded in 100-oriented Si substrates appears to be a concern only when the edges of 110-oriented islands such as 20'in FIG. 4 are bordered by changed-orientation Si regions 130, since the 110-oriented islands 20'bounded by oxide-filled trenches survive the high temperature defect-removal anneals with their original orientation intact.

Another concern with the ATR methods of U.S. patent application Ser. No. 10/725,850 is their reliance on ion implantation amorphization as the means by which the initial orientation information is removed from regions selected for orientation change. Alternative methods for effecting such crystalline-to-noncrystalline transformations in these selected regions would also be highly desirable.

SUMMARY OF THE INVENTION

The present invention provides an ATR method for forming low-defect density hybrid orientation substrates which avoids the problems of (i) corner defects in the ATR'd regions, and (ii) undesired orientation change of the non-ATR'd regions.

Specifically, the ATR method of the present invention comprises first fabricating a hybrid orientation substrate by the prior art processing steps described in U.S. patent application Ser. No. 10/725,850. In one embodiment disclosed in the '850 application, the hybrid oriented substrate is formed by: (i) forming a bilayer template stack comprising a direct silicon bonded (DSB) layer of Si having a first surface orientation (for example, a 110 orientation) disposed on an underlying Si substrate having a second surface orientation (for example, a 100 orientation), (ii) amorphizing selected regions of the DSB layer down to the underlying Si substrate layer to leave a DSB layer with amorphized and original-orientation regions, and (iii) performing a recrystallization anneal at or below a first temperature to convert the amorphized regions of the DSB layer into regions of changed-orientation Si having the orientation of the underlying Si substrate. Next, insulator-filled shallow trench isolation (STI) regions are formed to laterally separate the original-orientation and changed-orientation regions of the DSB layer. In accordance with the present invention, the isolation regions extend to a depth that is at least as deep as the DSB layer thickness. After forming the insulator-filled STI regions, a defect removal anneal is performed at or below a second temperature higher than the first temperature, with the STI regions in place, according to the prior art U.S. patent application Ser. No. 11/031,142.

More generally, the inventive method comprises:

providing a hybrid orientation substrate comprising a direct semiconductor bonded layer of a first surface orientation disposed on an underlying semiconductor substrate having a second surface orientation, wherein selected regions of the direct semiconductor bonded layer are amorphized and subjected to a recrystallization anneal at or below a first temperature providing selected regions of said direct semiconductor bonded layer having the second surface orientation;

forming a dielectric isolation region to laterally separate the selected regions of the direct semiconductor bonded layer having said second surface orientation from regions of the direct semiconductor bonded layer having said first surface orientation, wherein the dielectric isolation region extends to a depth that is at least as deep as the direct semiconductor bonded layer thickness; and performing a defect removal anneal at or below a second temperature higher than said first temperature.

This process flow with STI formation after the amorphization and low-temperature recrystallization steps but before a defect removal anneal avoids the two problems described above: (i) corner defects where the ATR'd regions contact STI, and (ii) the conversion of non-ATR'd (original orientation) DSB layer regions to the substrate orientation during the high-temperature defect removal anneal. In a slightly more complicated variation of this process flow, the trenches of the STI regions are formed before the defect removal anneal and filled with a permanent dielectric after the defect removal anneal, thereby eliminating the requirement that the STI fill be able to survive the defect removal anneal. In both process flows, the borders of the ATR'd regions adjacent to non-ATR'd DSB regions may contain defects after the recrystallization anneal. However, this is not a problem because these defective edge regions are quite localized (typically having a width of only about half the DSB layer thickness) and would ordinarily be replaced by STI.

While the inventive methods above were specifically described for the case of a Si DSB layer on a bulk Si substrate, they may also be implemented with other substrates (for example, Si-on-insulator (SOI) or semiconductor-on-insulator substrates instead of bulk Si substrates), with DSB and substrate layers comprising other semiconductor materials (e.g., Ge, Si-containing semiconductors such as SiGe alloys, these materials further including dopants, etc.), and/or with any combination of strained and unstrained layers.

In addition, the key concepts of (i) avoiding corner defects at Si/STI borders by recrystallizing the amorphized Si before STI formation, (ii) using insulator-filled isolation trenches positioned at the borders between changed-orientation ATR'd regions and original-orientation non-ATR'd regions to eliminate potentially defective border-region Si, and (iii) preserving the post-recrystallization dimensions of the changed-orientation ATR'd regions and original-orientation non-ATR'd DSB layer regions by using STI or STI-like features to laterally separate these regions from each other during high temperature defect-removal annealing may be generally applied to the many variations of the hybrid ATR methods described in U.S. patent application Ser. No. 10/725,850 without departing from the scope of the present invention. For example, the present invention may be applied to ATR schemes utilizing bottom amorphization and top templating, or schemes in which buried insulator layers are created after ATR.

A further aspect of the present invention teaches the use of laser-induced melting as an alternative or adjunct to ion implant amorphization in forming hybrid orientation substrates. For example, regions of a bilayer template stack selected for an orientation-changing ATR treatment as described here and in the original methods of U.S. patent application Ser. No. 10/725,850 may be subjected to a laser melting process that melts to a depth below the bonded interface separating upper and lower Si layers of different orientations. The resulting laser-melted regions are then recrystallized from the melt using the lower Si layer as a template.

More generally, this aspect of the inventive method for forming hybrid orientation substrates comprises the steps of:

providing a starting substrate comprising a direct semiconductor bonded layer of a first surface orientation disposed on an underlying semiconductor substrate layer having a second surface orientation, melting and recrystallizing selected regions of the direct semiconductor bonded layer to provide selected regions of said direct semiconductor bonded layer having the second surface orientation.

The underlying semiconductor substrate layer may be, for example, a bulk semiconductor wafer or a semiconductor-on-insulator layer. Insulator-filled isolation regions may be formed between the regions selected for orientation-changing melting and recrystallization and those not selected for orientation-changing melting and recrystallization. Additional defect-removal annealing may be performed after recrystallization, as described above.

DETAILED DESCRIPTION OF THE INVENTION

Figure 1A:
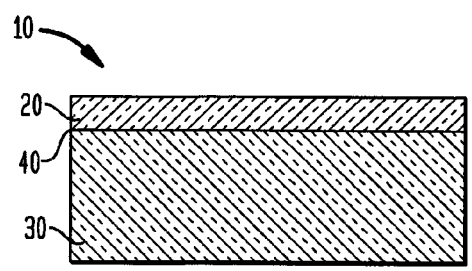
FIGS. 1A-1D are pictorial representations (through cross sectional views) illustrating an idealized top amorphization/bottom templating STI-before-ATR prior art process for forming a hybrid orientation Si substrate.
Figure 1B:
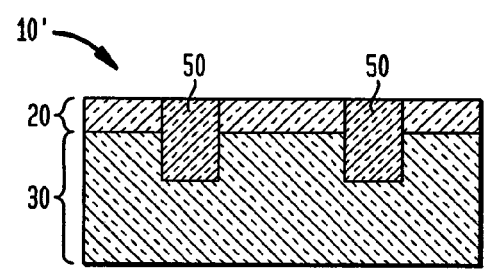
Figure 1C:
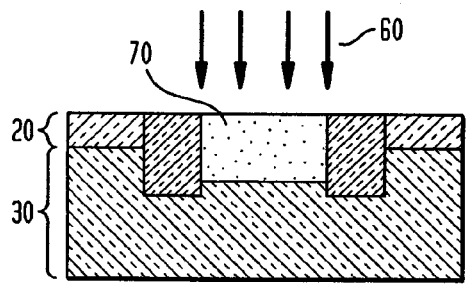
Figure 1D:
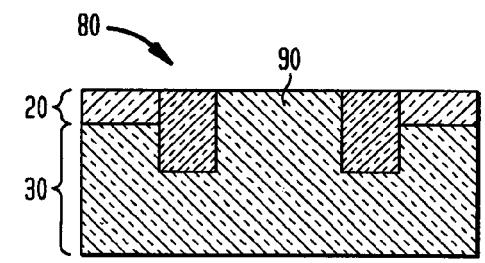
Figure 2A:
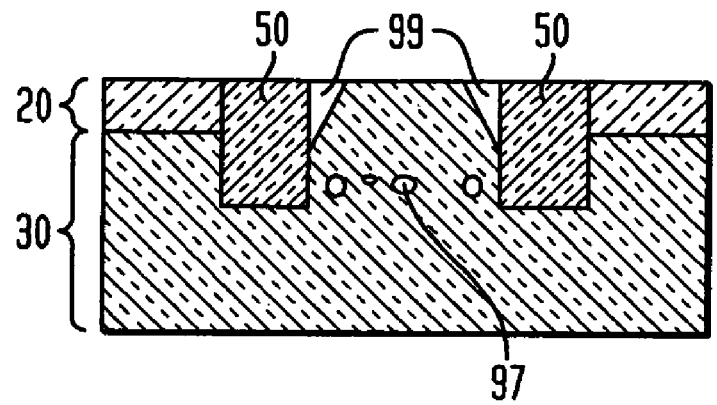
FIGS. 2A-2B are pictorial representations (through cross sectional views) illustrating the types and locations of defects remaining after the prior art STI-before-ATR process of FIG. 1.
Figure 2B:
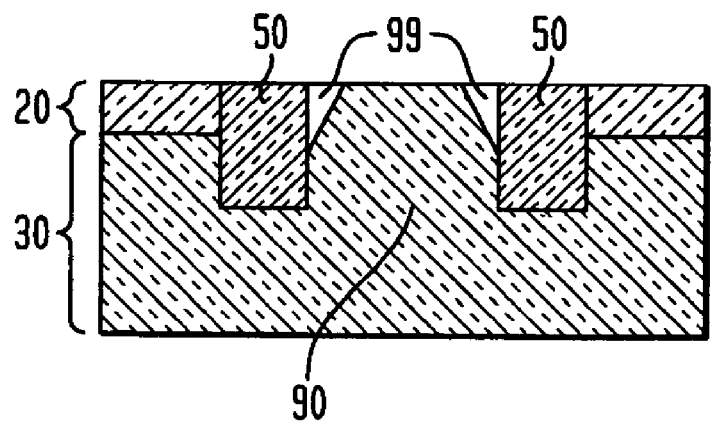
Figure 3A:
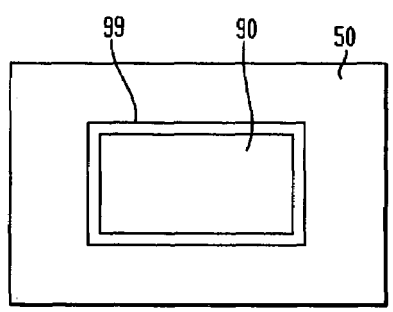
FIGS. 3A-3E show the geometry of the corner defects in relation to an FET device comprising changed-orientation ATR'd regions through plan views (FIGS. 3A and 3B) and cross sectional views (FIGS. 3C-3E)
Figure 3B:
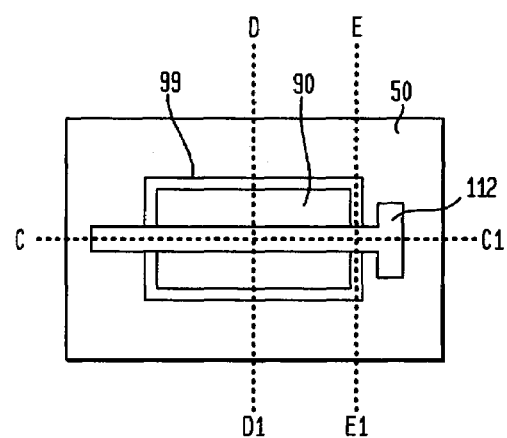
Figure 3C:
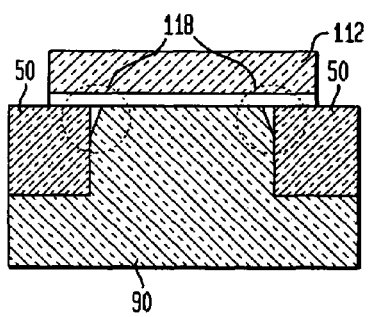
Figure 3D:
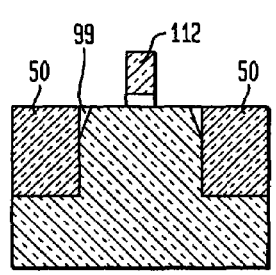
Figure 3E:
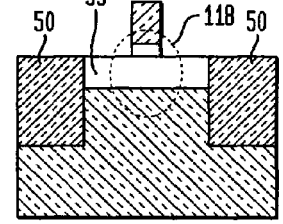
Figure 4A:
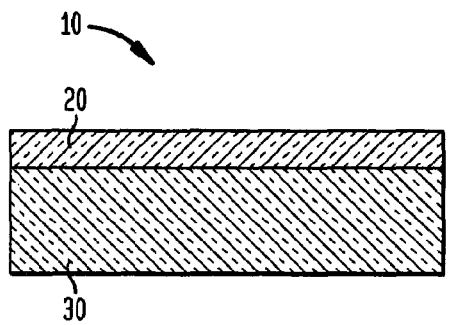
FIGS. 4A-4E are pictorial representations (through cross sectional views) illustrating an idealized top amorphization/bottom templating ATR-before-STI prior art process for forming a hybrid orientation Si substrate.
Figure 4B:
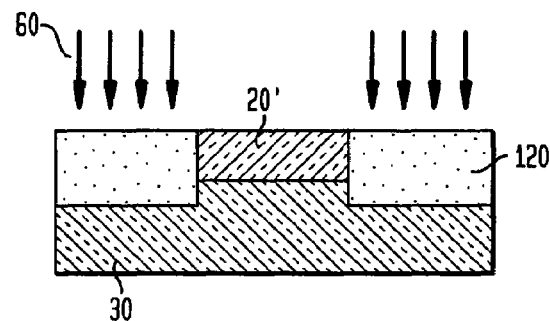
Figure 4C:
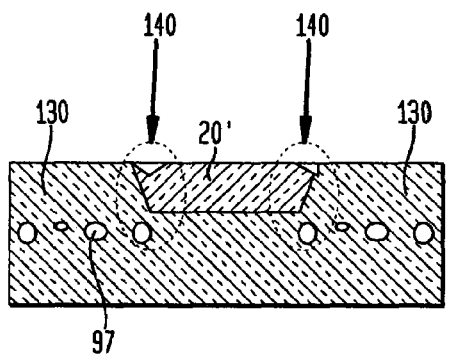
Figure 4D:
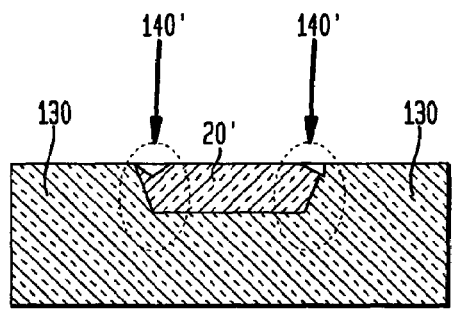
Figure 4E:
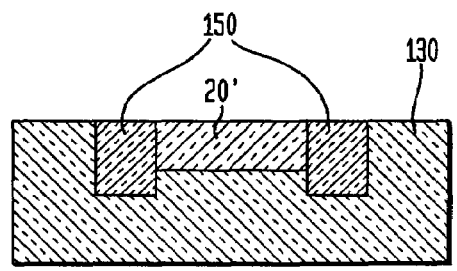

The present invention will now be described in more detail by referring to the drawings that accompany the present application. In the accompanying drawings, like and corresponding elements are referred to by like reference numerals. It is also noted that the drawings of the present invention representing the structures during the various processing steps of the present invention are provided for illustrative purposes and are thus not drawn to scale.

Figure 6A:
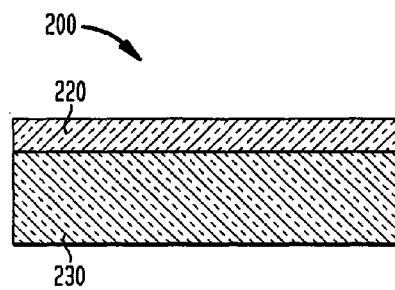
FIGS. 6A-6E are pictorial representations (through cross sectional views) illustrating the steps of a preferred embodiment of the inventive method for forming a low-defect density hybrid orientation substrate.
Figure 6B:
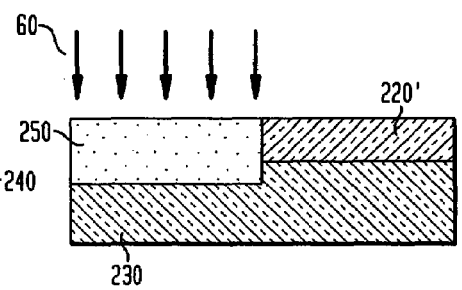
Figure 6C:
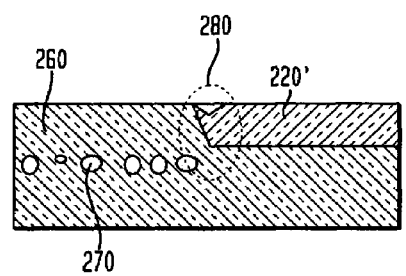
Figure 6D:
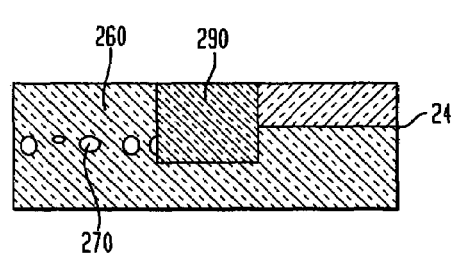

Reference is first made to FIGS. 6A-6E which are pictorial representations (through cross sectional views) illustrating the steps of a preferred embodiment of the inventive method for forming a low-defect density hybrid orientation substrate, i.e., a hybrid orientation substrate with no corner defects and a low ($<10^7/cm^2$) concentration of residual end-of-range defects. FIG. 6A shows a starting substrate 200 comprising an upper silicon layer 220 having a first crystal orientation, a lower silicon layer or substrate 230 having a second crystal orientation different from the first, and a bonded interface 240 between them. FIG. 6B shows substrate 200 of FIG. 6A being subjected to an amorphizing ion implant 60 to produce one or more amorphized regions 250 and non-amorphized regions 220'. Although not shown in FIG. 6B, the amorphizing ion implant 60 would typically be a blanket implant and regions 220' would typically be masked by some type of photoresist. Amorphized regions 250 span the entire thickness of the upper Si layer 220, and extend into the lower Si layer 230. Amorphized regions 250 are then recrystallized by an initial recrystallization anneal to produce changed-orientation Si regions 260 having the orientation of underlying Si layer 230 (which acts as a template). Changed-orientation ATR'd regions 260 are now bordered below by end-of-range defects 270 and bordered laterally by edge regions 280, as shown in FIG. 6C. FIG. 6D shows the structure of FIG. 6C after formation of dielectric isolation regions such as dielectric-filled shallow trench isolation (STI) regions 290 whose location and dimensions would typically be designed to subsume defective edge regions 280. To prevent undesired orientation changes of the original-orientation, non-ATR'd regions 220' during subsequent high temperature annealing, isolation regions 290 should extend below the interface 240. End-of range defects 270 are then removed by a high temperature defect-removal anneal to produce the hybrid orientation substrate structure 300 of FIG. 6E with low-defect-density changed-orientation ATR'd Si region 310 and non-ATR'd original orientation Si region 220' with STI region 290 between them. Devices such as FETs and other circuit elements (not shown) would then be fabricated on substrate 300 using techniques that are well known in the art.

Referring to the structure of FIG. 6A, the orientations of Si layers 220 and 230 may be selected from 100, 110, 111, and other major and minor Miller indices. For example, in a preferred embodiment of the invention, the upper Si layer 220 can have a 110 orientation and the lower Si layer 230 can have a 100 orientation. Alternatively, the upper Si layer 220 can have a 100 orientation and the lower Si layer 230 can have a 110 orientation.

As discussed in U.S. patent application Ser. Nos. 10/725,850 and 11/031,142, the initial recrystallization anneal used to convert the structure of FIG. 6B into the structure of FIG. 6C may be performed with any of a variety of prior art recrystallization conditions, such as, for example, temperatures from about 500° C. to about 900° C. Annealing at temperatures in the range from about 600° C. to about 650° C. in inert ambients for times of about 1 minute to about 2 hours are considered particularly preferable. In general, the annealing temperature should be high enough to produce a reasonable rate of recrystallization, yet low enough to ensure that the recrystallization is templated (rather than spontaneous and random). An additional consideration not discussed in U.S. patent application Ser. Nos. 10/725,850 and 11/031,142 is that the recrystallization should be performed under conditions mild enough to preserve the integrity of the non-ATR'd regions 220'. However, the non-ATR'd regions 220' are expected to be stable at all temperatures in the range typically used for recrystallization annealing. Furthermore, some dimensional changes in the non-ATR'd regions 220' may even be tolerable, since as mentioned above in connection with FIG. 5D, disappearance of the non-ATR'd regions 220' proceeds by a gradual bottom corner rounding rather than by a lateral translation of the edge regions. As a guide to selecting a suitable recrystallization anneal, it is noted that detectable corner rounding could be observed in the samples of FIGS. 5A-5D after a 2-hour anneal at 1050° C.

Figure 6E:
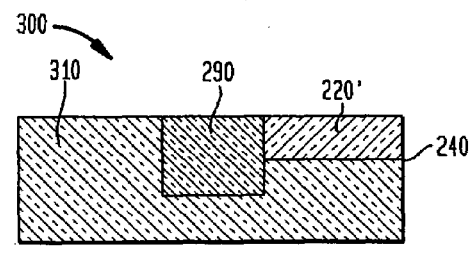

Options for the high temperature defect-removal anneal used for converting the structure of FIG. 6D to substrate structure 300 of FIG. 6E are described in U.S. patent application Ser. No. 11/031,142 and incorporated by reference. In particular, it is noted that the defect-removal anneal would typically be performed with a protective cap layer in place and at a temperature in the range from about 1200° C. to about 1320° C. However it should be noted that the high-temperature defect removal anneal may optionally be omitted or performed at a lower temperature (e.g., in a range from about 1000° C. to about 1200° C.) if the remaining defects do not adversely affect subsequent device performance and reliability. Interestingly, it has been found that the temperature/time conditions at which the end-of-range damage starts disappearing are much the same as those at which the non-ATR'd regions start showing bottom corner rounding.

Figure 7A:
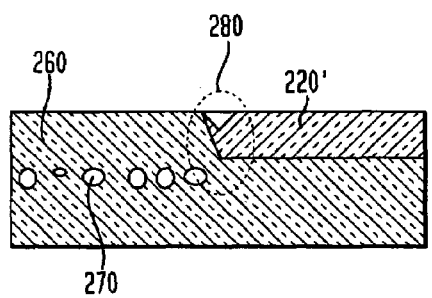
FIGS. 7A-7K are pictorial representations (through cross sectional views) illustrating a "disposable STI fill" variation of the method shown in FIGS. 6A-6E.
Figure 7B:
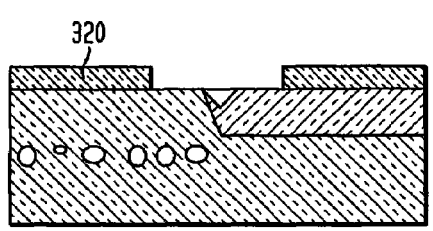
Figure 7C:
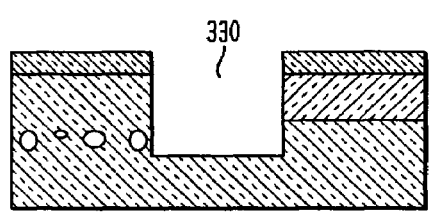
Figure 7D:
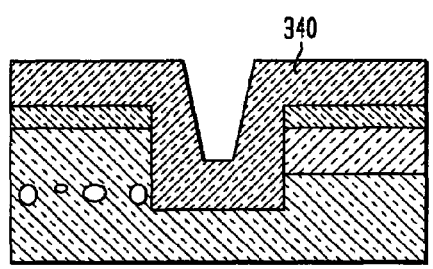
Figure 7E:
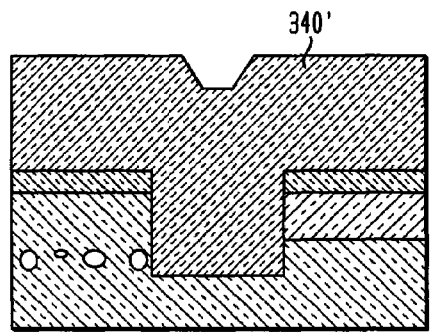
Figure 7F:
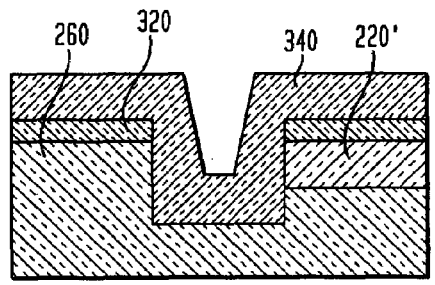
Figure 7G:
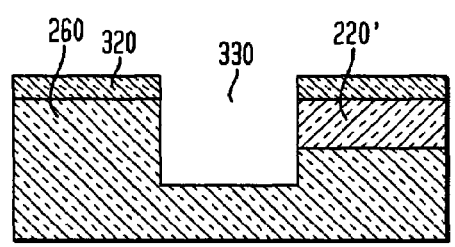
Figure 7H:
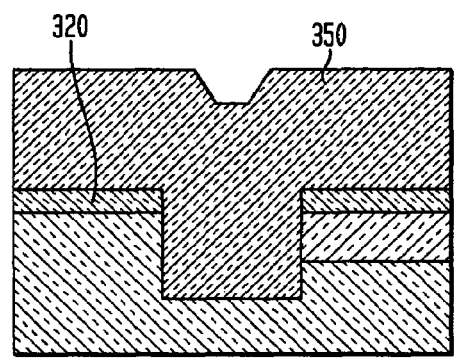
Figure 7I:
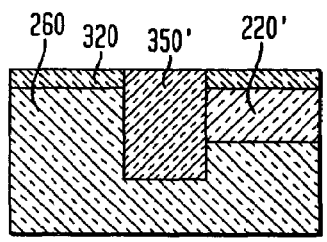
Figure 7J:
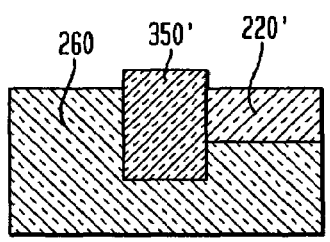
Figure 7K:
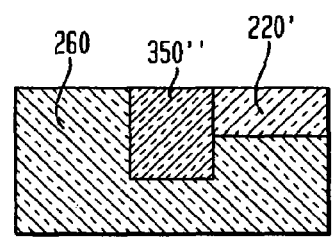

FIGS. 7A-7K show pictorial representations (through cross sectional views) of a "disposable STI fill" variation of the method of FIGS. 6A-6E. Specifically, FIG. 7A shows the structure of FIG. 6C, formed according to the process steps described in connection with the structures of FIGS. 6A-6B. FIG. 7B shows the structure of FIG. 7A after deposition and patterning of a hard mask layer 320, which also functions as a polish stop. Hard mask layer 320 would typically comprise a thin (on the order of about 5 to about 10 nm) $SiO_2$ underlayer and a thicker silicon nitride overlayer. FIG. 7C shows the structure of FIG. 7B after a trench etch to form cavities 330. Cavities 330 are then partially or completely filled with one or more disposable dielectrics to form the structure of FIG. 7D (in which cavity 330 is partially filled with dielectric 340) or FIG. 7E (in which cavity 330 is completely filled with dielectric 340'). Dielectric 340 protects the hard mask layers 320 and sides of the trenches 330 from oxidation during the defect removal annealing. Dielectric 340 is preferably $SiO_2$ and selectively removable with respect to the hard mask layer 320. FIG. 7F shows the structure of FIG. 7D after defect-removal annealing (the details of which were discussed above in connection with FIG. 6) which removes end-of-range damage loops 270. FIG. 7G shows the structure of FIG. 7F after removal of disposable dielectric 340. FIG. 7H shows the structure of FIG. 7G after deposition of one or more permanent dielectrics 350 to fill and overfill the cavity 330. Dielectric 350 is then planarized, stopping on the polish stop 320 to form the structure of FIG. 7H with filled STI region 350'. Finally, polish stop layers 320 are removed to form the structure of FIG. 7J, and STI region 350' is lightly etched back to form the structure of FIG. 7K with planar STI region 350".

While the process flows of FIGS. 6A-6E and 7A-7K are shown for the case of a Si DSB layer on a bulk Si substrate, the same process flow may also be implemented with other substrates (for example, Si-on-insulator (SOI) or semiconductor-on-insulator substrates instead of bulk Si substrates), with DSB and substrate layers comprising other semiconductor materials (e.g., Ge, Si-containing semiconductors such as SiGe alloys, these materials further including dopants, etc.), and/or with any combination of strained and unstrained layers to make any of the structures described in U.S. patent application Ser. No. 10/725,850.

Figure 8A:
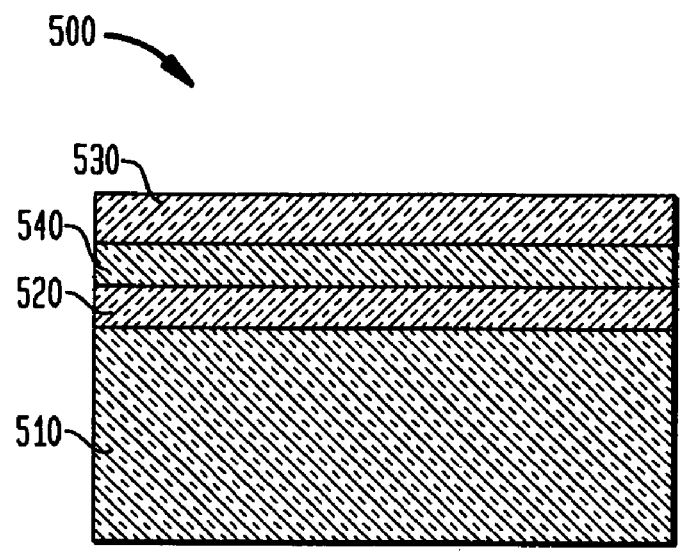
FIGS. 8A-8B are pictorial representations (through cross sectional views) illustrating initial and final structures for an SOI version of the methods of FIGS. 6A-6E and 7A-7K.
Figure 8B:
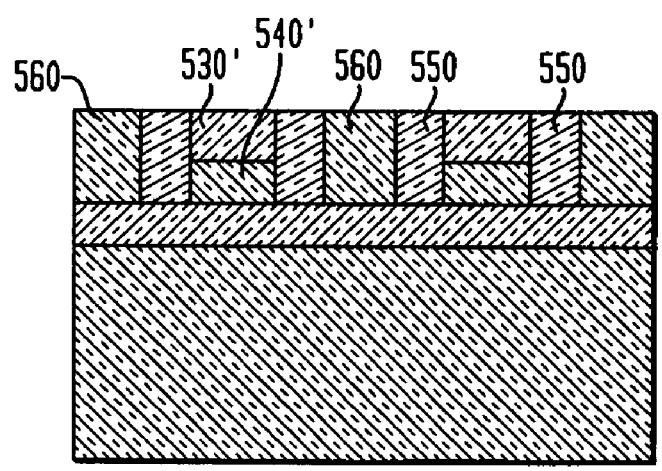

FIGS. 8A-8B are pictorial representations (through cross sectional views) illustrating initial and final structures for the process flows of FIGS. 6A-6E and 7A-7K exercised on an SOI substrate. FIG. 8A shows a starting substrate 500 comprising a handle wafer 510, a buried insulator layer 520, a DSB layer 530 having a first crystal orientation, and an SOI layer 540 having a second orientation different from the first, and FIG. 8B shows a final structure comprising smaller regions 530' and 540' of the original DSB and SOI layers 530 and 540, STI regions 550 and changed-orientation ATR'd regions 560.

As mentioned above, the key concepts of (i) avoiding corner defects at Si/STI borders by recrystallizing the amorphized Si before STI formation, (ii) using insulator-filled isolation trenches positioned at the borders between changed-orientation ATR'd regions and original-orientation non-ATR'd regions to eliminate potentially defective border-region Si, and (iii) preserving the post-recrystallization dimensions of the changed-orientation ATR'd regions and original-orientation non-ATR'd DSB layer regions by using STI or STI-like features to laterally separate these regions from each other during high temperature defect-removal annealing may be generally applied to the many variations of the hybrid ATR methods described in U.S. patent application Ser. No. 10/725,850 without departing from the scope of the present invention. For example, the present invention may be applied to ATR schemes utilizing bottom amorphization and top templating, or schemes in which buried insulator layers are created after ATR.

In particular, a low-defect-density hybrid orientation semiconductor-on-insulator substrate may be achieved by utilizing a bottom amorphization/top templating scheme comprising the steps of: forming a bilayer template layer stack on an insulating substrate layer, said bilayer stack comprising a first, lower, single crystal semiconductor-on-insulator layer having a first orientation and a second, upper single crystal semiconductor layer having a second orientation different from the first; amorphizing the lower semiconductor layer of the bilayer template stack in selected areas to form localized amorphized regions; performing a recrystallization anneal at or below a first temperature to convert the amorphized regions of the lower semiconductor layer into regions of changed-orientation Si having the orientation of the upper semiconductor layer; removing the upper semiconductor layer of the stack to expose the lower semiconductor layer; forming insulator-filled shallow trench isolation (STI) regions to laterally separate the original-orientation and changed-orientation regions of lower semiconductor wherein the isolation regions contact the insulating substrate layer; and performing a defect removal anneal at or below a second temperature higher than the first temperature.

Figure 9A:
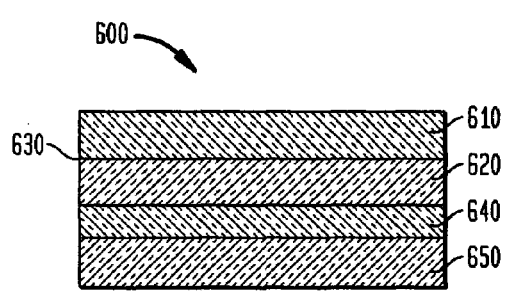
FIGS. 9A-9F are pictorial representations (through cross sectional views) illustrating the inventive method for the case of bottom amorphization/top templating.
Figure 9B:
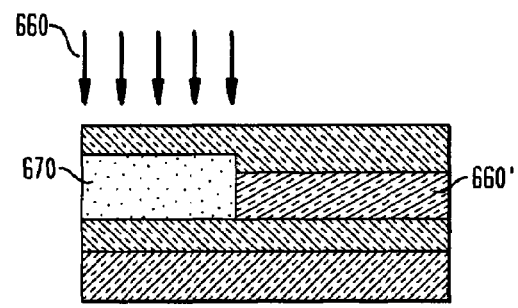
Figure 9C:
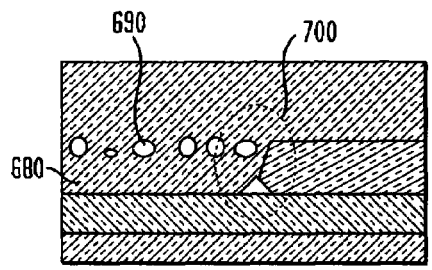
Figure 9D:
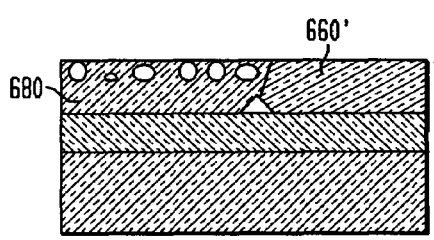
Figure 9E:
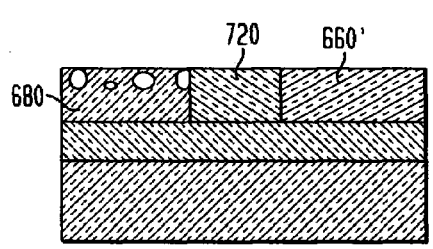

The steps of this process flow are shown in the pictorial representations (through cross sectional views) of FIGS. 9A-9F. Specifically, FIG. 9A shows a starting substrate 600 comprising an upper silicon layer 610 having a first crystal orientation and a lower silicon layer 620 having a second crystal orientation different from the first, and a bonded interface 630 between them. Lower silicon layer 620 is disposed on a buried insulator layer 640 on the substrate 650. FIG. 9B shows the substrate of FIG. 9A being subjected to an amorphizing ion implant 660 to produce one or more subsurface amorphized regions 670 and non-amorphized regions 660'. Although not shown in FIG. 6B, amorphizing ion implant 660 would typically be a blanket implant and regions 660' would typically be masked by some type of photoresist. Amorphized regions 670 span the entire thickness of lower Si layer 620, and extend into upper Si layer 610. Amorphized regions 670 are then recrystallized by a recrystallization anneal at or below a first temperature to produce changed-orientation ATR'd Si regions 680 having the orientation of overlying Si layer 610 (which acts as a template). ATR'd regions 680 are now bordered above by "beginning-of-range" defects 690 and bordered laterally by defective edge regions 700, as shown in FIG. 9C. FIG. 6D shows the structure of FIG. 9C after removal of the upper Si layer 610 by a process such as thermal oxidation/wet etch or chemical mechanical polishing. FIG. 9E shows the structure of FIG. 9D after formation of dielectric isolation regions such as dielectric-filled shallow trench isolation (STI) regions 720 which would typically subsume defective edge regions 700.

Figure 9F:
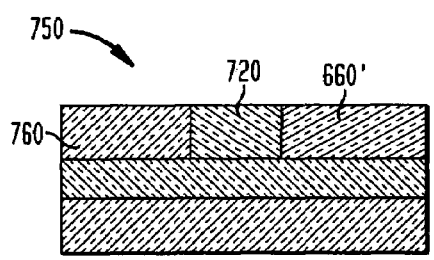

Beginning-of range defects 690 are then removed by a high temperature defect-removal anneal to produce the hybrid orientation substrate structure 750 of FIG. 9F with coplanar low-defect-density changed-orientation ATR'd Si region 760 having the first crystal orientation and non-ATR'd Si region 660' having the second (original) crystal orientation with STI region 750 between them. Devices such as FETs and other circuit elements (not shown) would then be fabricated on substrate 750 using techniques well known to those skilled in the art.

The conditions for the recrystallization anneal and the defect-removal anneals for the process flow of FIGS. 9A-9F should be similar to those described in connection with the process flows of FIGS. 6A-6E. As was the case of the process flow of FIGS. 7A-7K, the insulator-filled trenches of FIGS. 9A-9F may instead be filled or partially filled with a disposable insulator prior to the defect-removal anneal, with the disposable insulator being replaced with a permanent insulator after the defect removal anneal.

Figure 5A:
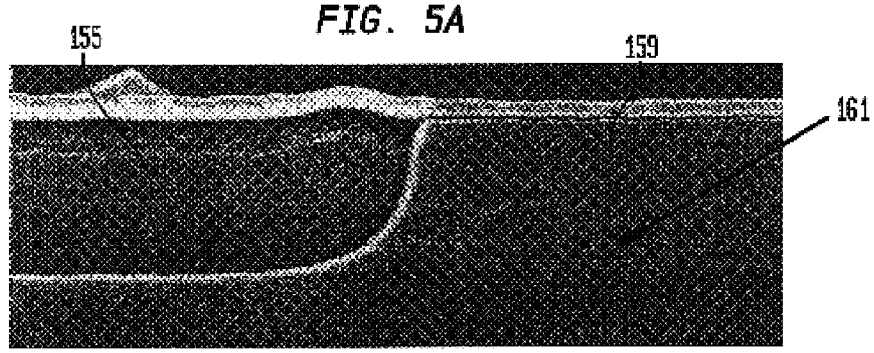
FIGS. 5A-5D show cross-section SEM images of border regions between ATR'd and non-ATR'd regions for a hybrid orientation substrate initially comprising a 110-oriented Si DSB layer on a 100-oriented Si handle wafer: after amorphization but before recrystallization (FIG. 5A), after a 900° C. recrystallization anneal (FIGS. 5B and 5C), and after a 1250° C. anneal (FIG. 5D)
Figure 5B:
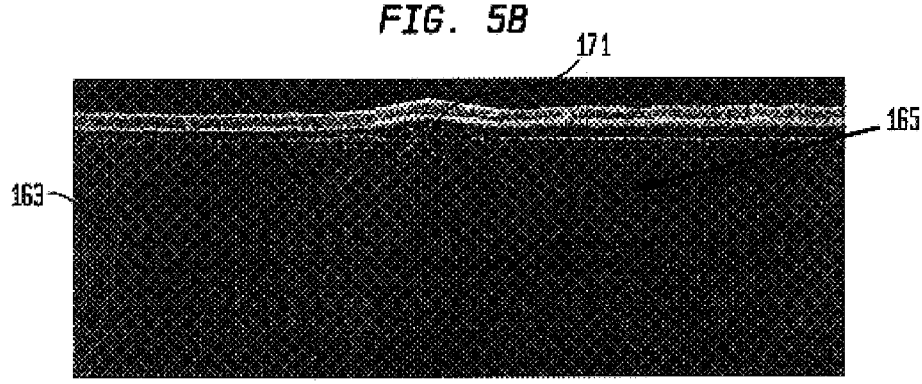
Figure 5C:
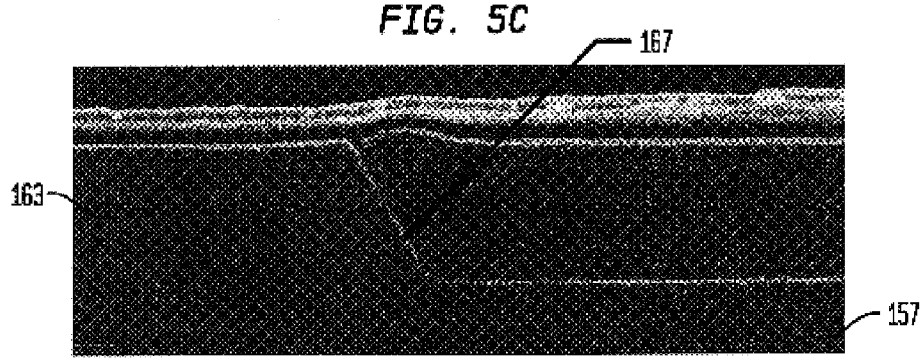
Figure 5D:
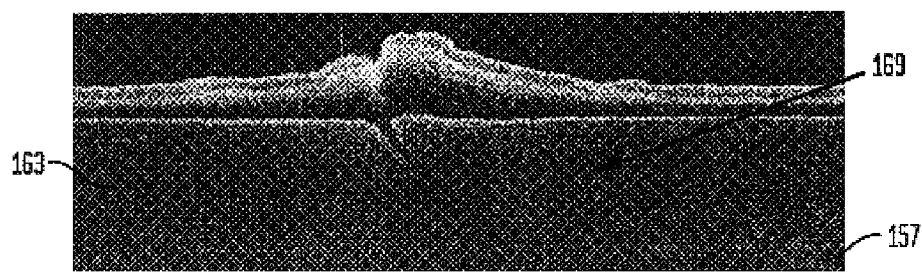

The observation that high temperature annealing can cause single crystal Si island regions of one orientation embedded in a Si substrate of a different orientation to undergo an orientation change that leaves the islands with the orientation of the substrate, was introduced in the Background section above as both as a primary motivation for the present invention and as a problem to be avoided. However, it should be noted that the same annealing conditions giving rise to this effect may on occasion be employed advantageously and deliberately to change the size, shape, and/or number of such islands. For example, annealing in certain temperature ranges can cause bottom corner rounding of the islands, as shown in FIG. 5D, or cause their complete disappearance.

Alternatively, selected islands may be preserved by laterally surrounding them with protective (filled or empty) trenches prior to annealing at time/temperature conditions sufficient to make the remaining (unprotected) islands disappear.

A further aspect of the present invention teaches the use of laser-induced melting as an alternative or adjunct to ion implant amorphization. For example, regions of a bilayer template stack selected for an orientation-changing ATR treatment as described here and in the original methods of U.S. patent application Ser. No. 10/725,850 may be subjected to a laser melting process that melts to a depth below the bonded interface separating upper and lower Si layers of different orientations. The resulting laser-melted regions are then recrystallized from the melt using the lower Si layer as a template.

A key issue with laser melting is the requirement that the melt depth (i) extend beyond the bonded interface in regions undergoing an orientation change (to ensure templating from the lower Si layer), and (ii) remain within the upper Si layer in regions not undergoing an orientation change (to ensure templating from the upper Si layer and a return to the original orientation). These requirements are most easily met by using blanket laser irradiation with antireflection (AR) coating layers atop Si regions where deep melting (and highest absorbed laser fluence) is desired, and no coatings or more reflective layers atop Si regions where shallow or no melting is desired. To minimize lateral templating, laser irradiation may be performed after STI is in place. Melt depth control and selectivity may also be improved by using ion implantation to amorphize the regions to be laser melted, since amorphous Si has a melting point several hundred ° C. lower than that of crystalline Si and thus can be induced to melt at fluences below the threshold for melting crystalline Si.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for forming a low-defect-density hybrid orientation substrate comprising:
   providing a hybrid orientation substrate comprising a direct semiconductor bonded layer of a first surface orientation disposed on an underlying semiconductor substrate having a second surface orientation, wherein selected regions of the direct semiconductor bonded layer are amorphized and subjected to a recrystallization anneal at or below a first temperature providing selected regions of said direct semiconductor bonded layer having the second surface orientation;
   forming a dielectric isolation region to laterally separate the selected regions of the direct semiconductor bonded layer having said second surface orientation from regions of the direct semiconductor bonded layer having said first surface orientation, wherein the dielectric isolation region extends to a depth that is at least as deep as the direct semiconductor bonded layer thickness; and
   performing a defect removal anneal at or below a second temperature higher than said first temperature.

2. The method of claim 1 wherein said underlying semiconductor substrate having said second surface orientation comprises a semiconductor-on-insulator layer.

3. The method of claim 1 wherein said direct semiconductor bonded layer and said underlying semiconductor substrate comprise a semiconductor material selected from the group consisting of SiGe, Si, and Ge.

4. The method of claim 3 wherein said semiconductor material further comprises a dopant.

5. The method of claim 3 wherein said semiconductor material comprises any combination of strained and unstrained layers.

6. The method of claim 1 wherein said first and second surface orientations comprise one of 100, 110, and 111.

7. The method of claim 1 wherein said first surface orientation is 110 and said second surface orientation is 100.

8. The method of claim 1 wherein said providing said hybrid oriented substrate comprises (i) forming a bilayer template stack comprising said direct semiconductor bonded layer disposed on said semiconductor substrate, (ii) amorphizing selected regions of the direct semiconductor bonded layer down to the underlying semiconductor substrate to leave a selected region with amorphized and original-orientation regions, and (iii) performing a recrystallization anneal at or below said first temperature to convert the amorphized region into a region of changed-orientation semiconductor having the orientation of the underlying semiconductor substrate.

9. The method of claim 1 wherein said recrystallization anneal includes annealing in a temperature range from about 500° C. to about 900° C.

10. The method of claim 1 wherein said defect-removal anneal includes annealing in a temperature range from about 1200° C. to about 1350° C.

11. The method of claim 1 wherein said dielectric isolation region is a trench isolation region.

12. The method of claim 1 wherein said dielectric isolation region is filled or partially filled with a disposable insulator prior to the defect-removal anneal, said disposable insulator being replaced with a permanent insulator after the defect-removal anneal.

13. The method of claim 1 wherein said direct semiconductor bonded layer of said first surface orientation, said selected region of said direct semiconductor bonded layer having said second surface orientation and said dielectric isolation region each have an upper surface that is coplanar with each other.

14. A method for forming a low-defect-density hybrid orientation substrate comprising:
   providing a hybrid orientation substrate comprising a direct semiconductor bonded layer of a first surface orientation disposed on an underlying semiconductor substrate having a second surface orientation, wherein selected regions of the direct semiconductor bonded layer are amorphized and subjected to a recrystallization anneal at or below a first temperature providing selected regions of said direct semiconductor bonded layer having the second surface orientation;
   forming a dielectric isolation region to laterally separate the selected regions of the direct semiconductor bonded layer having said second surface orientation from regions of the direct semiconductor bonded layer having said first surface orientation, wherein the dielectric isolation region extends to a depth that is at least as deep as the direct semiconductor bonded layer thickness and is filled or partially filled with a disposable insulator;
   performing a defect removal anneal at or below a second temperature higher than said first temperature; and
   replacing said disposable insulator with a permanent insulator.

* * * * *